US007003057B2

(12) United States Patent
Hasegawa (10) Patent No.: US 7,003,057 B2
(45) Date of Patent: Feb. 21, 2006

(54) RECEPTION AGC CIRCUIT (75) Inventor: Osamu Hasegawa, Tokyo (JP)

(73) Assignee: NEC Corporation, Tokyo (JP)

(*) Notice: Subject to any disclaimer, the term of this patent is extended or adjusted under 35 U.S.C. 154(b) by 824 days.

(21) Appl. No.: 09/983,592

(22) Filed: Oct. 25, 2001

(65) Prior Publication Data
US 2002/0071507 A1    Jun. 13, 2002

(30) Foreign Application Priority Data
Oct. 27, 2000    (JP)    .............................. 2000-328268

(51) Int. Cl.
H04L 27/08    (2006.01)
(52) U.S. Cl. ..................... 375/345; 375/364; 375/150; 375/141; 375/317; 370/311; 704/217
(58) Field of Classification Search ................ 375/334, 375/364, 150, 345, 141, 317; 370/311; 704/217
See application file for complete search history.

(56) References Cited

U.S. PATENT DOCUMENTS

| 4,292,598 | A | * | 9/1981 | Yasumura | .................... 330/281 |
| 4,574,252 | A | | 3/1986 | Slack | |
| 5,452,332 | A | | 9/1995 | Otani et al. | |
| 6,118,829 | A | * | 9/2000 | North | ......................... 375/317 |
| 6,184,940 | B1 | * | 2/2001 | Sano | .......................... 348/655 |
| 6,185,432 | B1 | | 2/2001 | Vembu | |
| 6,246,735 | B1 | * | 6/2001 | Sano et al. | .................. 375/364 |
| 6,310,865 | B1 | * | 10/2001 | Ohki | ........................ 370/311 |
| 6,459,724 | B1 | * | 10/2002 | Yoneyama | ................... 375/150 |
| 6,700,921 | B1 | * | 3/2004 | Shibuta | ........................ 375/141 |
| 6,708,146 | B1 | * | 3/2004 | Sewall et al. | ................ 704/217 |
| 6,775,336 | B1 | * | 8/2004 | Takaki | ......................... 375/345 |

FOREIGN PATENT DOCUMENTS

| CN | 1375148 | 10/2002 |
| JP | 06-216955 | 8/1994 |
| JP | 07-235847 | 9/1995 |
| JP | 09-205385 | 8/1997 |
| JP | 10-233815 | 9/1998 |
| JP | 2000-036790 | 2/2000 |
| JP | 2001-086179 | 3/2001 |
| WO | WO 99/20005 | 4/1999 |
| WO | WO 02/07402 | 1/2002 |

* cited by examiner

Primary Examiner—Shuwang Liu
Assistant Examiner—Eva Zheng
(74) Attorney, Agent, or Firm—Foley & Lardner LLP (57) ABSTRACT

A reception AGC circuit includes a high-speed power calculating circuit for calculating the power of an input signal at a short period, a normal power calculating circuit for calculating the power at a normal period, a circuit for receiving a power calculation result from the high-speed power calculating circuit or normal power calculating circuit to calculate a feedback amplification value, and addition amplification value setting units for self-station communication and peripheral station monitoring which receive the feedback amplification value through a switch and add the feedback amplification value to an amplifier in use. The high-speed power calculating circuit is switched to the normal power calculating circuit in accordance with the value of the difference between the power calculation result obtained by the high-speed power calculating circuit and a predetermined target reception power, and the addition amplification value setting units for self-station communication and peripheral station monitoring are selectively switched depending on whether communication with an external device is self-station communication or peripheral station monitoring.

8 Claims, 6 Drawing Sheets

RECEPTION AGC CIRCUIT

BACKGROUND OF THE INVENTION

1. Field of the Invention

The present invention relates to a reception AGC circuit and, more particularly, to a reception AGC circuit which converges to a target reception level in an early stage at high speed and converges, in repeating peripheral station monitoring and self-station communication, to a target reception level at each frequency.

2. Description of the Prior Art

Figure 1:
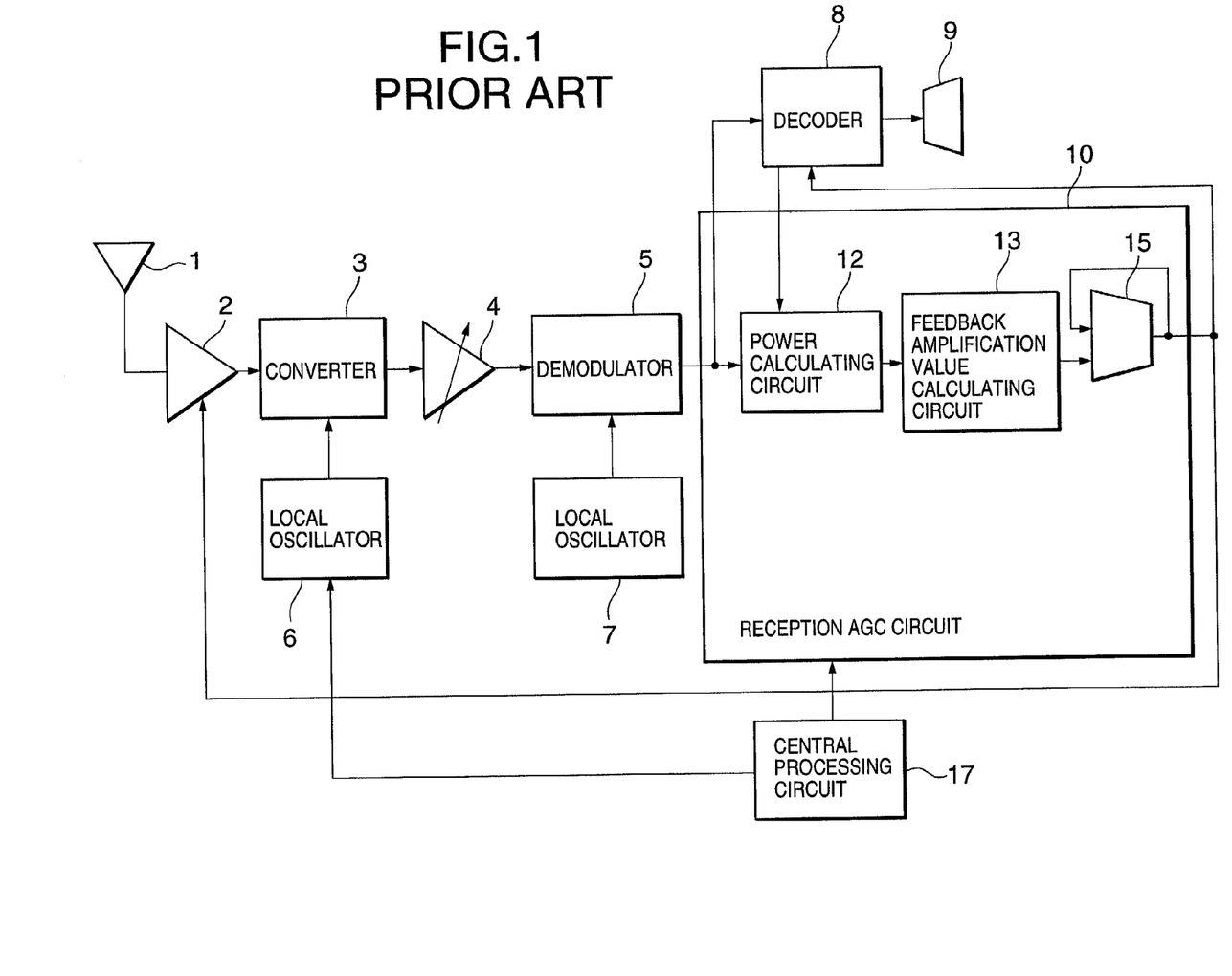
FIG. 1 is a block diagram showing the arrangement of a conventional heterodyne radio receiver.

FIG. 1 shows the arrangement of a conventional heterodyne radio receiver.

As shown in FIG. 1, a reception AGC circuit 10 in the conventional heterodyne radio receiver is comprised of a power calculating circuit 12, a feedback amplification value calculating circuit 13, and an addition amplification value setting unit 15. The power calculating circuit 12, which operates at a fixed period, cannot perform tracking operation quickly when the receiver takes a long rise time and converges to a reception dynamic range under a fading environment.

In addition, when a frequency shift occurs in peripheral station monitoring or the like or self-station communication at the initial frequency is restored, the AGC (Automatic Gain control) convergence time becomes undesirably long at the time of the start-up of the radio unit.

SUMMARY OF THE INVENTION

The present invention has been made in consideration of the above situation in the prior art, and has as its object to provide a reception AGC circuit which converts to a target reception level at high speed in the early stage of operation, and also converges to a target reception level at high speed at each frequency when peripheral station monitoring and self-station communication are repeatedly performed.

In order to achieve the above object, according to the first main aspect of the present invention, there is provided a reception AGC circuit comprising a high-speed power calculating circuit for calculating power of an input signal at a short period, a normal power calculating circuit for calculating power at a normal period, and a circuit for receiving a power calculation result from the high-speed power calculating circuit or normal power calculating circuit to calculate a feedback amplification value, wherein the high-speed power calculating circuit is switched to the normal power calculating circuit in accordance with a value of a difference between the power calculation result obtained by the high-speed power calculating circuit and target reception power.

The high-speed power calculating circuit in the reception AGC circuit according to the first main aspect is switched to the normal power calculating circuit at the time of power-on operation or intermittent operation in accordance with the value of the difference.

In addition, the feedback amplification value calculating circuit in the AGC circuit according to the first main aspect continuously calculates a feedback amplification value on the basis of the power calculation result obtained by the normal power calculating circuit when the high-speed power calculating circuit is switched to the normal power calculating circuit.

Furthermore, the high-speed power calculating circuit and the normal power calculating circuit in the reception AGC circuit according to the first main aspect are switched with a hysteresis such that the high-speed power calculating circuit is switched to the normal power calculating circuit when the value of the difference is not more than a first error value, and the normal power calculating circuit is switched to the high-speed power calculating circuit when the value of the difference is not less than a second error value.

In order to achieve the above object, according to the second main aspect of the present invention, there is provided a reception AGC circuit comprising a high-speed power calculating circuit for calculating power of an input signal at a short period, a normal power calculating circuit for calculating power at a normal period, a circuit for receiving a power calculation result from the high-speed power calculating circuit or normal power calculating circuit to calculate a feedback amplification value, and addition amplification value setting units for self-station communication and peripheral station monitoring which receive the feedback amplification value through a switch and add the feedback amplification value to an amplifier in use, wherein the high-speed power calculating circuit is switched to the normal power calculating circuit in accordance with a value of a difference between the power calculation result obtained by the high-speed power calculating circuit and a predetermined target reception power, and the addition amplification value setting units for self-station communication and peripheral station monitoring are selectively switched depending on whether communication with an external device is self-station communication or peripheral station monitoring.

The addition amplification value setting unit for peripheral station monitoring in the AGC circuit according to the second main aspect comprises a plurality of addition amplification value setting units in accordance with the number of stations having peripheral station monitors with which communications are to be made.

As is obvious from the respective aspects described above, according to the present invention, the reception AGC circuit includes the high-speed power calculating circuit for calculating power of an input signal at a short period, the normal power calculating circuit for calculating power at a normal period, and the circuit for receiving a power calculation result from the high-speed power calculating circuit or normal power calculating circuit to calculate a feedback amplification value. The high-speed power calculating circuit is switched to the normal power calculating circuit in accordance with a value of a difference between the power calculation result obtained by the high-speed power calculating circuit and target reception power. This makes it possible to shorten the rise time of the receiver.

Since the high-speed power calculating circuit is switched to the normal power calculating circuit in accordance with the value of the difference at the time of power-on operation or intermittent operation, the rise time of the receiver can be shortened at the time of power-on operation or intermittent operation of the radio unit.

The feedback amplification value calculating circuit continuously calculates a feedback amplification value on the basis of the power calculation result obtained by the normal power calculating circuit when the high-speed power calculating circuit is switched to the normal power calculating circuit. This makes stable operation possible.

In addition, the high-speed power calculating circuit and the normal power calculating circuit are switched with a hysteresis such that the high-speed power calculating circuit is switched to the normal power calculating circuit when the value of the difference is not more than a first error value, and the normal power calculating circuit is switched to the high-speed power calculating circuit when the value of the difference is not less than a second error value. Therefore, stable operation can be performed.

The reception AGC circuit according to the present invention further comprises addition amplification value setting units for self-station communication and peripheral station monitoring which receive the feedback amplification value through a switch and add the feedback amplification value to an amplifier in use. In this arrangement, the high-speed power calculating circuit is switched to the normal power calculating circuit in accordance with a value of a difference between the power calculation result obtained by the high-speed power calculating circuit and a predetermined target reception power, and the addition amplification value setting units for self-station communication and peripheral station monitoring are selectively switched depending on whether communication with an external device is self-station communication or peripheral station monitoring. Even if, therefore, self-station communication and peripheral station monitoring are repeatedly performed, the rise time of the receiver in each station can be shortened.

Furthermore, since the addition amplification value setting unit for peripheral station monitoring comprises a plurality of addition amplification value setting units in accordance with the number of stations having peripheral station monitors with which communications are to be made. Even if, therefore, a plurality of peripheral station monitors are required, the rise time of the radio unit in each station can be shortened.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Some preferred embodiments of the present invention will be described below with reference to the accompanying drawings.

Figure 2:
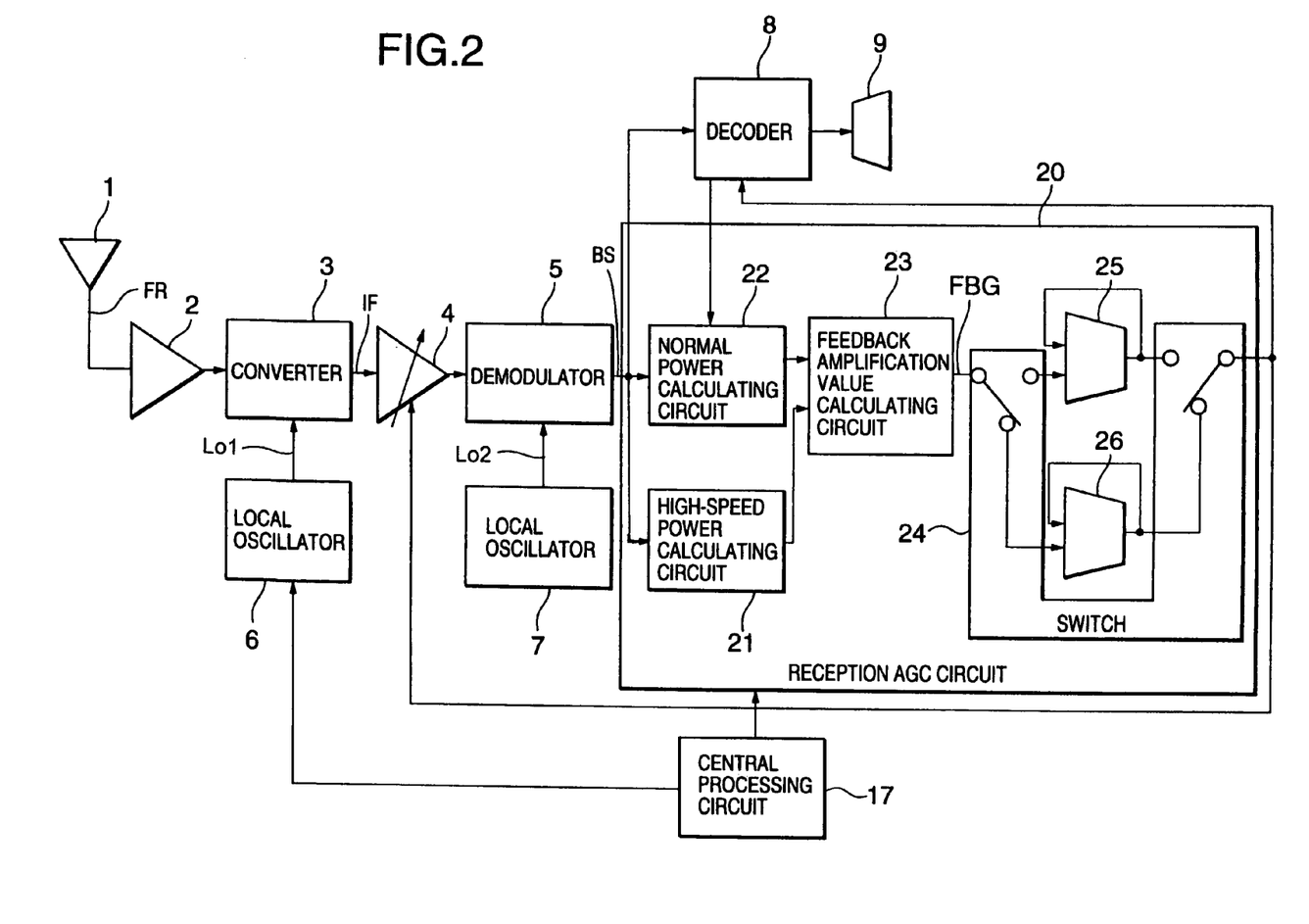
FIG. 2 is a block diagram showing the arrangement of a conventional heterodyne radio receiver having a reception AGC circuit according to an embodiment of the present invention.

FIG. 2 is a block diagram showing the arrangement of a heterodyne radio receiver having a reception AGC circuit 20 according to an embodiment of the present invention.

As shown in FIG. 2, in the heterodyne radio receiver, an antenna 1 is connected to a low-noise amplifier 2 for amplifying an input reception signal RF. The low-noise amplifier 2 is connected to a converter 3 for converting the amplified reception signal RF into an intermediate frequency signal IF. The intermediate frequency signal IF output from the converter 3 is input to a reception section gain variable amplifier 4 for amplifying a signal to a predetermined level. An output from the reception section gain variable amplifier 4 is input to a demodulator 5 to be demodulated into a baseband signal BS. A local signal Lo1 generated by a local oscillator 6 is input to the converter 3. A local signal Lo2 generated by a local oscillator 7 is input to the demodulator 5.

The baseband signal BS output from the demodulator 5 is input to a decoder 8 to be demodulated into, for example, voice. The decoder 8 then sends out the output to a speaker 9.

The baseband signal BS is also input to the reception AGC circuit 20. In the reception AGC circuit 20, the baseband signal BS is input to a high-speed power calculating circuit 21 and normal power calculating circuit 22, and outputs from the high-speed power calculating circuit 21 and normal power calculating circuit 22 are input to a feedback amplification value calculating circuit 23. An output from the feedback amplification value calculating circuit 23 is input to an addition amplification value setting unit 25 for self-station communication or an addition amplification value setting unit 26 for peripheral station monitoring. An output from the addition amplification value setting unit 25 or 26 is selectively input to the reception section gain variable amplifier 4 and decoder 8 through a switch 24. A slot timing signal or frame timing signal is input from the decoder 8 to the normal power calculating circuit 22.

A central processing circuit 17 is connected to the reception AGC circuit 20 and local oscillator 6 to ON/OFF-control the reception AGC circuit 20 and control the oscillation frequency of the local oscillator 6.

The operation of the heterodyne radio receiver circuit shown in FIG. 2 will be described next.

The reception signal RF input from the antenna 1 is amplified by the low-noise amplifier 2. The converter 3 converts the amplified reception signal RF into the intermediate frequency signal IF by using the local signal Lo1 generated by the local oscillator 6. The intermediate frequency signal IF is gain-controlled by the reception section gain variable amplifier 4 so as to make the input level of the demodulator 5 constant. The resultant signal is demodulated with the local signal Lo2 generated by the local oscillator 7. The demodulated signal is output as the baseband signal BS and input to the decoder 8 and reception AGC circuit 20. The decoder 8 extracts, for example, only voice data from the signal and sends it out to the speaker 9, thereby outputting voice from the speaker 9. The decoder 8 extracts a slot timing or frame timing from the baseband signal BS, and sends it out to the reception AGC circuit 20.

The baseband signal BS will be described below.

Figure 3:
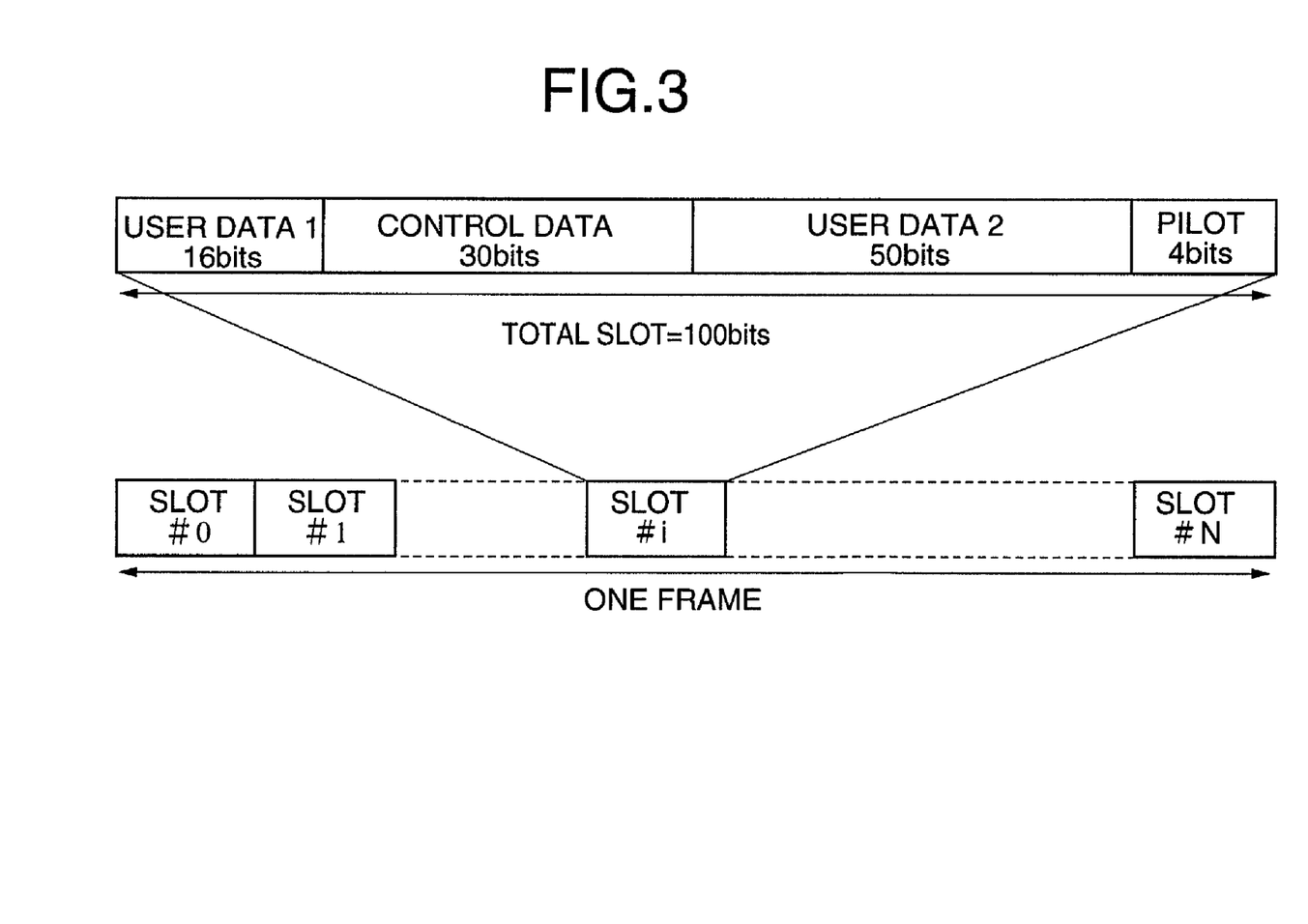
FIG. 3 is a view showing the data format of a baseband signal BS.

FIG. 3 is a view showing the data format of the baseband signal BS.

In general, as shown in FIG. 3, in a data stream sent in a radio interval, data used for control and reporting of a state, sent from the other party (network), is time-divisionally mapped, in addition to a pilot signal and user data (e.g., voice) so as to allow the radio unit to easily establish synchronization. The minimum unit in this mapping is a slot, and a higher-order unit is a frame. For example, N-frame user data is one data unit. By monitoring a pilot signal or the like, therefore, a slot, frame timing signal, or the like can be easily extracted, and user data can also be extracted.

The reception AGC circuit 20 will be described in detail next.

The baseband signal BS (I (In-phase signal)/Q (Quadrature-phase signal), in practice) is input to the high-speed power calculating circuit 21 and normal power calculating circuit 22.

Equation (1) given below is used to calculate an average Pow. The high-speed power calculating circuit 21 and normal power calculating circuit 22 basically calculate the average power Pow by:

$$Pow = \frac{\sum_{1}^{k} \sqrt{I^2 + Q^2}}{k} \qquad (1)$$

where k is the number of I/Q data.

If, for example, the number of I/Q data in one slot is 100, the normal power calculating circuit 22 can calculate the slot average power NPow for each slot by:

$$Pow(NPow) = \frac{\sum_{1}^{100} \sqrt{I^2 + Q^2}}{100} \qquad (2)$$

in synchronism with the slot timing signal input from the decoder 8. When a plurality of N slots are averaged, the N slots may be accumulated/added, and the resultant value may be averaged.

The high-speed power calculating circuit 21 can calculate the average power of I/Q data corresponding to 10 slots at a period of $\frac{1}{10}$ by:

$$Pow(FPow) = \frac{\sum_{1}^{10} \sqrt{I^2 + Q^2}}{10} \qquad (3)$$

so as to operate sufficiently faster than the normal power calculating circuit 22. This makes it possible to always calculate the slot average power FPow.

Note that the high-speed power calculating circuit 21 and normal power calculating circuit 22 may be integrated into one circuit designed to simply change k (the number of I/Q data) in equation (1).

The feedback amplification value calculating circuit 23 compares the slot average power FPow and slot average power NPow respectively output from the high-speed power calculating circuit 21 and normal power calculating circuit 22 to compute the value of the difference.

The feedback amplification value FBG which is the computation result obtained by the feedback amplification value calculating circuit 23 is added to the amplification set value of one of the addition amplification value setting unit 25 and addition amplification value setting unit 26 which is in use, thereby determining an amplification value G(t) (amplification value G(t)=G amplification value (t−1)+feedback amplification value FBG) of the reception section gain variable amplifier 4 in the next step.

The central processing circuit 17 determines the logic of the switch 24 depending on whether self-station (same frequency) or peripheral station (different frequency) monitoring is performed. In the case of self-station communication, the addition amplification value setting unit 25 is selected. In the case of peripheral station monitoring, the addition amplification value setting unit 26 is selected. An output from the selected addition amplification value setting unit 25 or addition amplification value setting unit 26 is input to the reception section gain variable amplifier 4, thus controlling the amplification value G(t) in the next step.

The output from the addition amplification value setting unit 25 or 26 is also input to the decoder 8. The decoder 8 generally performs a weighted computation and error correction for each slot or frame on the basis of each slot or frame output from the reception AGC circuit 20 as shown in FIG. 3 to simplify the processing. Demodulation is performed with high accuracy although a detailed description thereof will be omitted.

Figure 4:
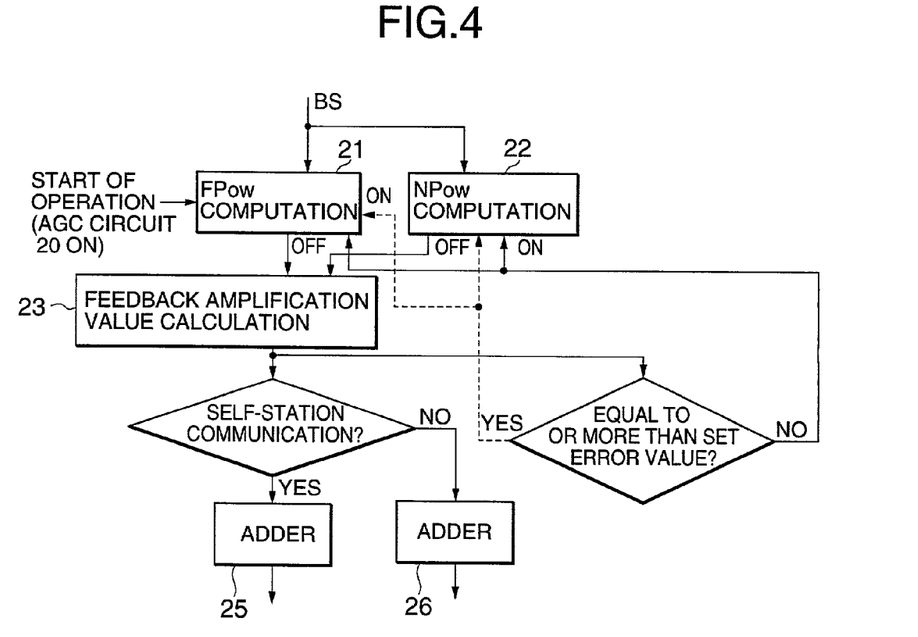
FIG. 4 is a flow chart showing the operation of the reception AGC circuit according to the embodiment of the present invention.

FIG. 4 is a flow chart showing the operation of the reception AGC circuit 20.

As shown in FIG. 4, when the reception AGC circuit 20 is to be turned on by the central processing circuit 17 (see FIG. 2) at the start of operation, e.g., power-on operation or frequency switching, the high-speed power calculating circuit 21 is designated by the central processing circuit 17. The high-speed power calculating circuit 21 calculates average power. The feedback amplification value calculating circuit 23 obtains the difference between the average power and the target power RPow predetermined by the feedback amplification value calculating circuit 23. The central processing circuit 17 controls the switch 24 to add the value of the difference to the value set in the addition amplification value setting unit 25 in the case of self-station communication and to the value set in the addition amplification value setting unit 26 in the case of peripheral station monitoring. Likewise, the central processing circuit 17 controls the switch 24 to input the above output to the reception section gain variable amplifier 4 and decoder 8.

In this case, if the output value of the difference is equal to or more than a first predetermined error value, the feedback amplification value calculating circuit 23 operates to select the high-speed power calculating circuit 21 as a power calculating circuit for the next calculation. If this value is less than the first error value, the feedback amplification value calculating circuit 23 operates to select the normal power calculating circuit 22. Once the normal power calculating circuit 22 is selected, the normal power calculating circuit 22 always operates without comparison with the first error value so as to simplify demodulation and realize stable operation, as described above.

Figure 5:
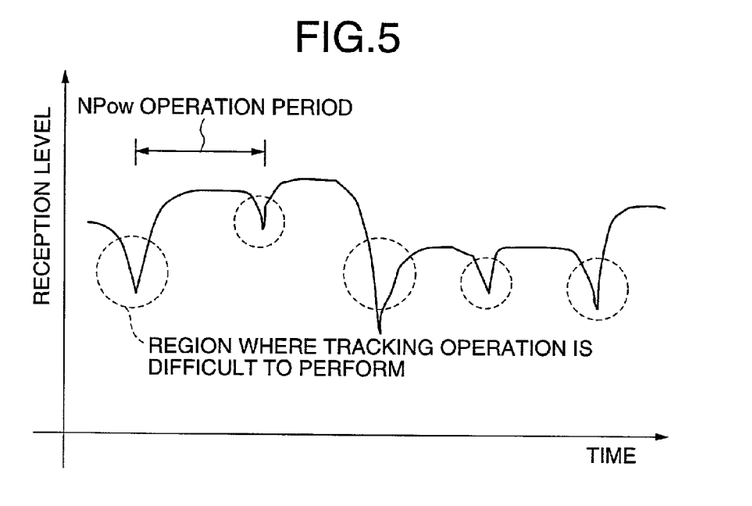
FIG. 5 is a graph for explaining the operation of the embodiment of the present invention.

To perform stable, accurate demodulation under a fading environment like that shown in FIG. 5 after the normal power calculating circuit 22 is selected, the circuit may always be operated with a second error value (e.g., second error value>first error value) having a margin with respect to the dynamic range of reception. Alternatively, the high-speed power calculating circuit 21 may be switched to the normal power calculating circuit 22 if the value of the difference is equal to or less than the predetermined first error value. If this value is equal to or larger than the second error value, the normal power calculating circuit 22 is switched to the high-speed power calculating circuit 21. In this manner, switching operation can be performed with hysteresis.

Figure 6:
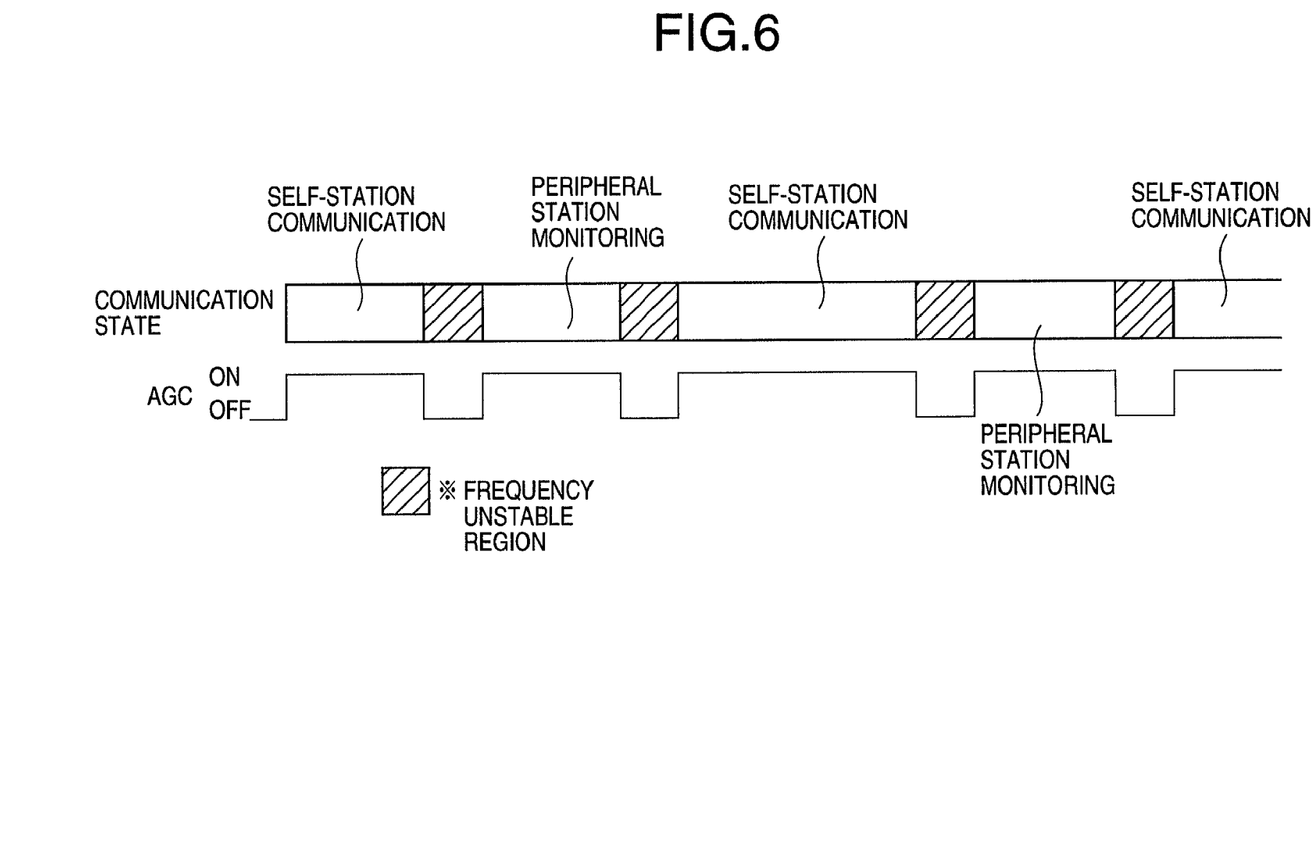
FIG. 6 is a view for explaining the operation of the embodiment of the present invention.

As shown in FIG. 6, in the above operation, in an unstable frequency region due to frequency switching time and the like at the time of power-on operation, switching from self-station communication to peripheral station monitoring or from peripheral station monitoring to self-station communication, or the like, the reception AGC circuit 20 is turned off to prevent operation error. Therefore, the OFF state switches to the ON state without fail, and an operation flow is executed with events like those shown in FIG. 6.

As described above, the reception AGC circuit 20 can shorten the rise time of the receiver at the time of power-on or intermittent operation of the radio unit.

This is because the reception AGC circuit 20 includes the high-speed power calculating circuit 21 and normal power calculating circuit 22, and switches/operates the high-speed power calculating circuit 21 and normal power calculating circuit 22 at the time of start-up of the reception AGC circuit 20 while monitoring the value of a difference from a target reception power.

The reception AGC circuit 20 can perform tracking operation at high speed and realizes stable modulation even under a fading environment.

This is because a start value and normal value for the reception AGC circuit 20 are provided as error values used for switching between the high-speed power calculating circuit 21 and normal power calculating circuit 22, and the latter error value is used in normal operation, while the normal power calculating circuit 22 is operated upon switching only under a condition in which switching between the power calculating circuits does not easily occur, e.g., in a case where the reception dynamic range is exceeded.

In addition, the reception AGC circuit 20 can shorten the rise time of the receiver in each station when self-station communication and peripheral station monitoring are repeatedly performed.

Again, this is because the reception AGC circuit 20 includes the addition amplification value setting unit 25 for self-station communication and addition amplification value setting unit 26 for peripheral station monitoring, and switches/operates the addition amplification value setting unit 25 and addition amplification value setting unit 26, including circuits for providing the above effects, independently.

Figure 7:
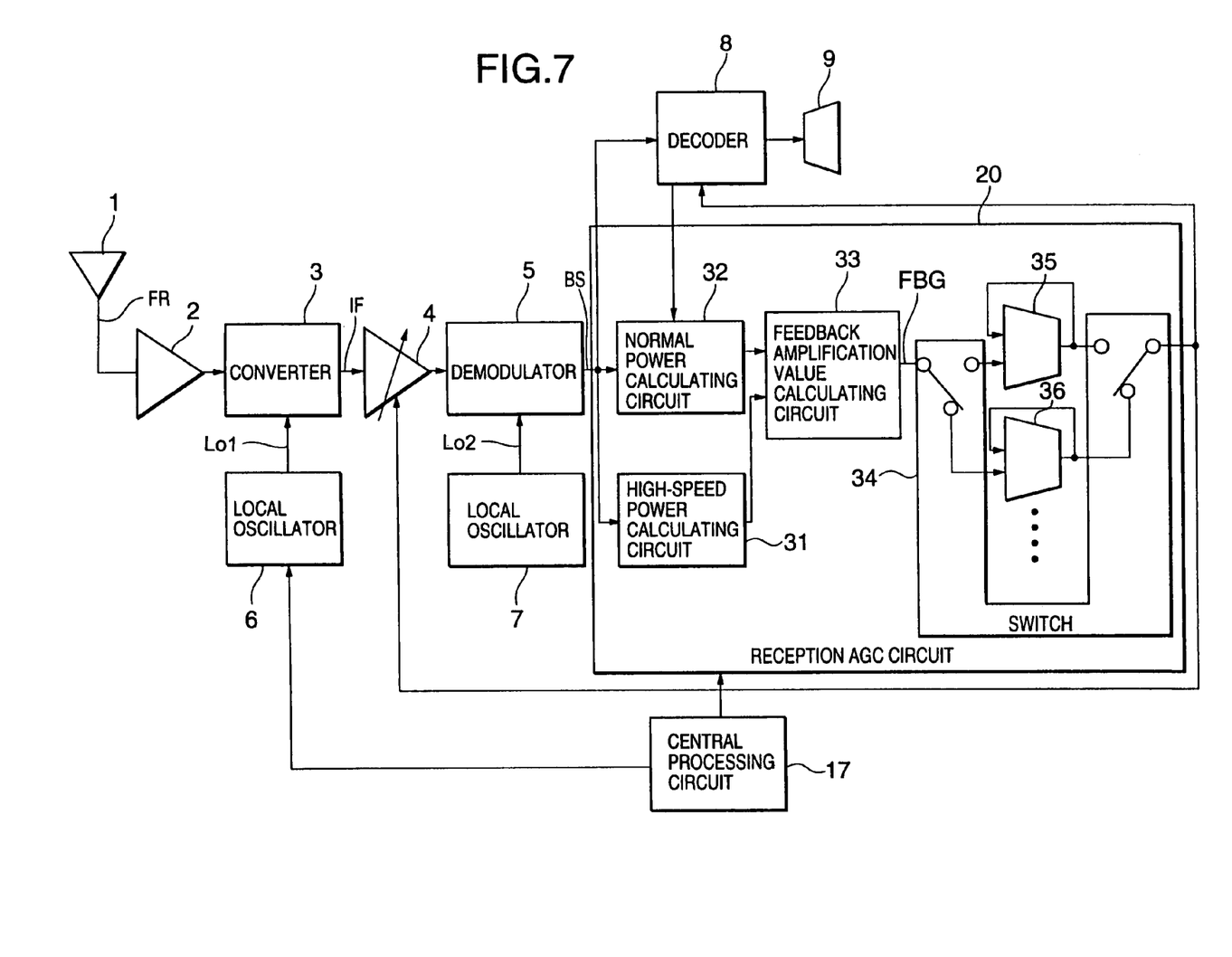
FIG. 7 is a block diagram showing the arrangement of a heterodyne radio receiver having a reception AGC circuit according to another embodiment of the present invention.

FIG. 7 is a block diagram showing the arrangement of a heterodyne radio receiver having a reception AGC circuit 30 according to another embodiment of the present invention.

As shown in FIG. 7, when N peripheral station monitors are required, the reception AGC circuit 30 of this heterodyne radio receiver includes N+1 (self-station+N stations) addition amplification value setting units 35, 36, . . . , and switches/operates the units for the respective stations (frequencies), thereby realizing the same operation as that in the above embodiment. As a consequence, the same effects as those described above can be obtained.

What is claimed is:

1. A reception AGC circuit comprising:
a high-speed power calculating circuit for calculating power of an input signal at a short period,
a normal power calculating circuit for calculating power at a normal period, and
a circuit for receiving a power calculation result from said high-speed power calculating circuit or normal power calculating circuit to calculate a feedback amplification value,
wherein said high-speed power calculating circuit is switched to said normal power calculating circuit in accordance with a value of a difference between the power calculation result obtained by said high-speed power calculating circuit and target reception power.

2. A circuit according to claim 1, wherein said high-speed power calculating circuit is switched to said normal power calculating circuit at the time of at least one of power-on operation and intermittent operation in accordance with the value of the difference.

3. A circuit according to claim 1, wherein said feedback amplification value calculating circuit continuously calculates a feedback amplification value on the basis of the power calculation result obtained by said normal power calculating circuit when said high-speed power calculating circuit is switched to said normal power calculating circuit.

4. A circuit according to claim 1, wherein said high-speed power calculating circuit and said normal power calculating circuit are switched with a hysteresis such that said high-speed power calculating circuit is switched to said normal power calculating circuit when the value of the difference is not more than a first error value, and said normal power calculating circuit is switched to said high-speed power calculating circuit when the value of the difference is not less than a second error value.

5. A reception AGC circuit comprising a high-speed power calculating circuit for calculating power of an input signal at a short period, a normal power calculating circuit for calculating power at a normal period, a circuit for receiving a power calculation result from said high-speed power calculating circuit or normal power calculating circuit to calculate a feedback amplification value, and addition amplification value setting units for self-station communication and peripheral station monitoring which receive the feedback amplification value through a switch and add the feedback amplification value to an amplifier in use, wherein said high-speed power calculating circuit is switched to said normal power calculating circuit in accordance with a value of a difference between the power calculation result obtained by said high-speed power calculating circuit and a predetermined target reception power, and said addition amplification value setting units for self-station communication and peripheral station monitoring are selectively switched depending on whether communication with an external device is self-station communication or peripheral station monitoring.

6. A circuit according to claim 5, wherein said addition amplification value setting unit for peripheral station monitoring comprises a plurality of addition amplification value setting units in accordance with the number of stations having peripheral station monitors with which communications are to be made.

7. A circuit according to claim 1,
wherein said high-speed power calculating circuit is switched to said normal power calculating circuit when the value of the difference is less than a predetermined error value.

8. A circuit according to claim 1,
wherein said normal power calculating circuit is switched to said high-speed power calculating circuit when the value of the difference is greater than a predetermined error value.

* * * * *